United States Patent
Chon et al.

(10) Patent No.: US 11,539,339 B2
(45) Date of Patent: Dec. 27, 2022

(54) AUDIO SIGNAL PROCESSING METHOD AND APPARATUS FOR FREQUENCY SPECTRUM CORRECTION

(71) Applicant: GAUDIO LAB, INC., Seoul (KR)

(72) Inventors: Sangbae Chon, Seoul (KR); Jeonghun Seo, Seoul (KR); Taegyu Lee, Seoul (KR); Younghoon Kwon, Seoul (KR); Hyunoh Oh, Gyeonggi-do (KR)

(73) Assignee: GAUDIO LAB, INC., Seoul (KR)

(*) Notice: Subject to any disclaimer, the term of this patent is extended or adjusted under 35 U.S.C. 154(b) by 0 days.

(21) Appl. No.: 17/086,298

(22) Filed: Oct. 30, 2020

(65) Prior Publication Data
US 2021/0135644 A1    May 6, 2021

(30) Foreign Application Priority Data
Nov. 1, 2019 (KR) .................. 10-2019-0138455

(51) Int. Cl.
H03G 5/16 (2006.01)
H03G 5/00 (2006.01)
H04R 3/04 (2006.01)

(52) U.S. Cl.
CPC .......... *H03G 5/165* (2013.01); *H03G 5/005* (2013.01); *H04R 3/04* (2013.01)

(58) Field of Classification Search
CPC .......... H03G 5/005; H03G 5/165; H04R 3/04
See application file for complete search history.

(56) References Cited

U.S. PATENT DOCUMENTS

| | | | | |
|---|---|---|---|---|
| 2008/0025530 | A1* | 1/2008 | Romesburg | H03G 7/002 381/106 |
| 2012/0063614 | A1* | 3/2012 | Crockett | H03G 5/165 381/98 |
| 2017/0094409 | A1* | 3/2017 | Baumgarte | G10L 19/00 |
| 2017/0207762 | A1* | 7/2017 | Porter | H03G 5/165 |

FOREIGN PATENT DOCUMENTS

| | | |
|---|---|---|
| KR | 10-2006-0075134 | 7/2006 |
| KR | 10-2015-0109418 | 10/2015 |

OTHER PUBLICATIONS

Office Action dated Oct. 4, 2022 for Korean Patent Application No. 10-2020-0143015 and its English translation provided by Applicant's foreign counsel.

\* cited by examiner

*Primary Examiner* — Daniel R Sellers
(74) *Attorney, Agent, or Firm* — Ladas & Parry, LLP (57) ABSTRACT

An audio signal processing apparatus is provided. The audio signal processing apparatus includes an input terminal receiving an input audio signal, a processor obtaining a difference between a playback loudness of the input audio signal and a desired loudness thereof and correcting a frequency band spectrum of an output audio signal for each of a plurality of frequency bands based on the difference between the playback loudness and the desired loudness of the input audio signal and a relationship between a loudness and a sound pressure for each of the plurality of frequency bands, and an output terminal outputting the output audio signal. The playback loudness is a loudness of the output audio signal when the input audio signal is output without the correction.

14 Claims, 9 Drawing Sheets

AUDIO SIGNAL PROCESSING METHOD AND APPARATUS FOR FREQUENCY SPECTRUM CORRECTION

TECHNICAL FIELD

The present disclosure relates to an audio signal processing method and apparatus. More specifically, the present disclosure relates to an audio signal processing method and apparatus for frequency spectrum correction.

BACKGROUND ART

As the mainstream audio technology has transitioned from analog to digital, the loudness can be expressed in a wider range and differently depending on contents.

Although international standards organizations such as International Telecommunication Union (ITU) and European Broadcasting Union (EBU) have announced standards, it is not well implemented in practice since the target loudness levels may be all different during the content production process. In addition, a method and standard for measuring loudness may be different for each country, and thus there is a limitation in that it is difficult to directly use corresponding loudness information.

Following the psychoacoustic characteristics that sound quality feels better as the loudness increases, content creators provide users with content that is mixed with louder sounds, which shows a trend of competitively increasing audio levels, which is called loudness war. For this reason, users perceive the loudness differently between contents or even within one content and thus the users have to tune up or down the volume from time to time, which is cumbersome. The volume and the loudness perceived by the listener do not match. Therefore, there is a limitation that consistent tone is not provided by volume tuning. In particular, as the use of personalized equalizers is becoming more common and there is a growing interest in tone, an audio signal processing method for maintaining a consistent tone is required.

DISCLOSURE

Technical Problem

An object of an embodiment of the present disclosure is to provide an audio signal processing method and apparatus for frequency spectrum correction.

Technical Solution

In accordance with an exemplary embodiment of the present invention, an audio signal processing apparatus includes an input terminal provided to receive an input audio signal, a processor configured to obtain a difference between a playback loudness of the input audio signal and a desired loudness thereof, and correct a frequency band spectrum of an output audio signal for each of a plurality of frequency bands based on the difference between the playback loudness and the desired loudness of the input audio signal and a relationship between a loudness and a sound pressure for each of the plurality of frequency bands, and an output terminal provided to output the output audio signal. The playback loudness may be a loudness of the output audio signal when the input audio signal is output without the correction.

The processor may be configured to obtain the desired loudness based on a characteristic of an output device outputting the output audio signal.

The characteristic of the output device may include a maximum loudness level that the output device is capable of outputting.

The spectrum correction gain for each of the plurality of frequency bands used for the correction may be 0 dB or more in all frequency bands.

The processor may be configured to obtain the playback loudness based on a playback volume.

The playback volume may be a volume applied independently of the output device.

The playback volume may be a volume of the output device.

In accordance with another exemplary embodiment of the present invention, an operation method for an audio signal processing apparatus includes receiving an input audio signal, obtaining a difference between a playback loudness of the input audio signal and a desired loudness thereof, correcting a frequency band spectrum of an output audio signal for each of a plurality of frequency bands based on the difference between the playback loudness and the desired loudness of the input audio signal and a relationship between a loudness and a sound pressure for each of the plurality of frequency bands, and outputting the output audio signal. The playback loudness may be a loudness of the output audio signal when the input audio signal is output without the correction.

The obtaining the difference between the playback loudness of the input audio signal and the desired loudness thereof may comprise obtaining the desired loudness based on a characteristic of an output device outputting the output audio signal.

The characteristic of the output device may include a maximum loudness level that the output device is capable of outputting.

The correction spectrum gain for each of the plurality of frequency bands used for the correction may be 0 dB or more in all frequency bands.

The obtaining the difference between the playback loudness of the input audio signal and the desired loudness thereof may comprise obtaining the playback loudness based on a playback volume.

The playback volume may be a volume applied independently of the output device.

The playback volume may be a volume of the output device.

Advantageous Effects

An embodiment of the present invention is to provide an audio signal processing method and apparatus for frequency spectrum correction.

MODE FOR CARRYING OUT THE INVENTION

Hereinafter, embodiments of the present invention will be described in detail with reference to the accompanying drawings so that those skilled in the art may easily perform the present invention. However, the present invention may be implemented by various modifications and is not limited to the embodiments described herein. In the drawings, in order to clarify the present invention, parts that are not related to description are omitted and like reference numerals represent like elements throughout the specification.

In addition, when a part "includes" an element, unless described to the contrary, the term "includes" does not indicate that another element is excluded but instead indicates that the other element may be further included.

Figure 1:
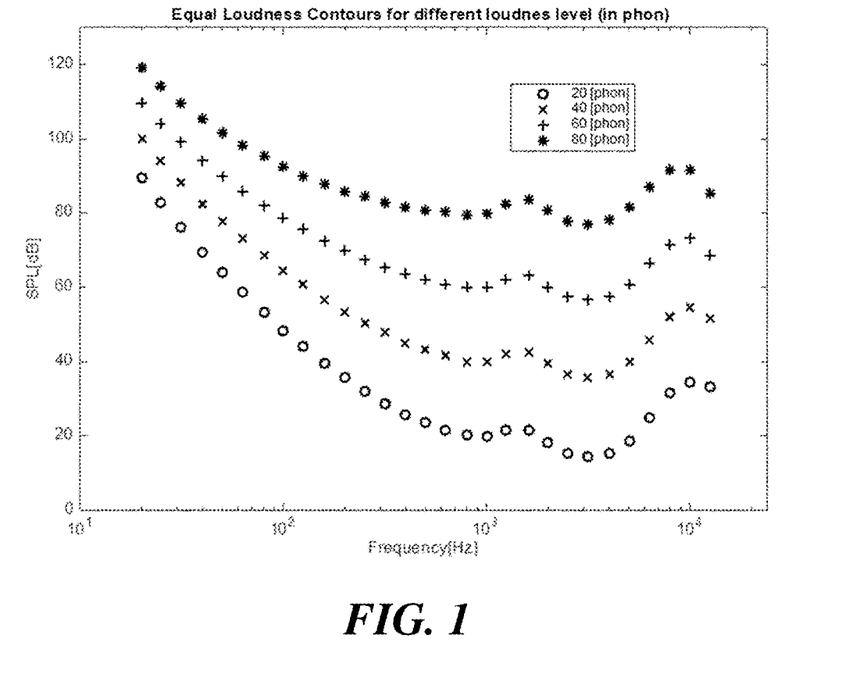
FIG. 1 is a diagram illustrating equal-loudness contours for each loudness level.

FIG. 1 is a diagram illustrating equal-loudness contours for each loudness level.

Sound pressure represents the absolute intensity of sound. Loudness represents the amount of sound that is subjectively perceived by a listener. Accordingly, the loudness may not increase as the sound pressure increases, and the loudness may not decrease as the sound pressure decreases. In addition, when sound pressures of the same magnitude are applied to signals of different frequencies, the listener perceives the magnitudes of loudness as being different. Therefore, in order for the listener to perceive the magnitudes of loudness as being the same, the level of sound pressure is to be different for each frequency. This is illustrated by equal-loudness counters in FIG. 1. According to the relationship between the loudness and the sound pressure described above, the tone of the sound before the volume tuning and the tone of the sound perceived after the volume tuning may be different. Therefore, when the volume of the output sound is tuned, an audio signal processing apparatus needs to correct the frequency spectrum in consideration of loudness. A detailed frequency spectrum correction method will be described with reference to FIGS. 2 to 8.

Figure 2:
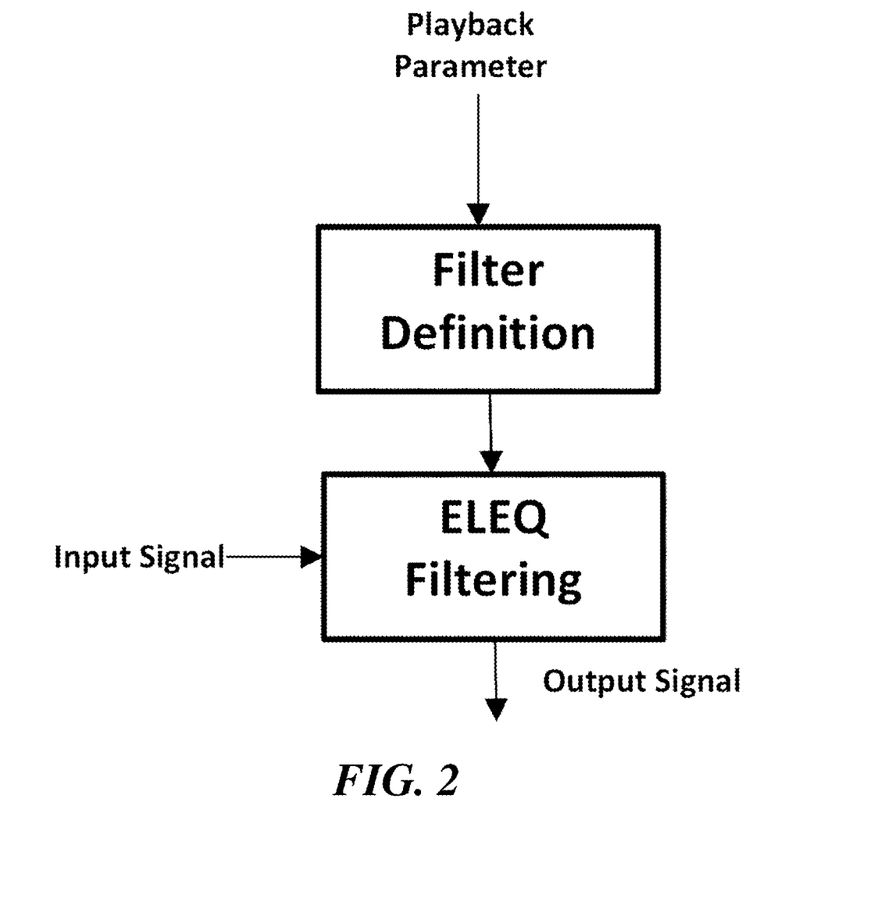
FIG. 2 is a block diagram illustrating correction of a frequency spectrum of an audio signal according to an embodiment of the present invention.

FIG. 2 is a block diagram illustrating adjusting of a frequency spectrum of an audio signal according to an embodiment of the present invention.

An audio signal processing apparatus receives an input signal. The audio signal processing apparatus may correct the frequency spectrum based on a difference between the desired loudness and a playback loudness, which is the loudness of the output audio signal output when the frequency spectrum is not corrected. The audio signal processing apparatus determines the playback loudness of the output signal. The audio signal processing apparatus may determine the playback loudness based on the loudness and the playback parameter of the input signal. To this end, the audio signal processing apparatus may measure the loudness of the input signal. The audio signal processing apparatus may obtain a loudness measurement value of an audio signal by using an auditory scale-based loudness filter. Specifically, the loudness filter may be at least one of an inverse filter of equal-loudness contours or a K-weighting filter approximating the same. For example, the audio signal processing apparatus may obtain a loudness measurement value by applying the loudness filter to at least a portion of the previously received input signal. The portion may be unit time used to obtain one loudness measurement value. The portion may include at least one frame. The unit time used to obtain one loudness measurement value may be referred to as a measurement window. In another specific embodiment, the audio signal processing apparatus may receive information indicating a loudness level of an input signal. The playback parameter may include at least one of a playback volume, an equalizer applied when processing an audio signal, and a loudness normalization parameter. In this case, the playback volume may be a volume applied independently of an output device outputting audio signals. In this case, the playback volume may be a volume of an output device outputting audio signals. In another specific embodiment, the playback volume may be a combination of a volume independently applied from the output device outputting audio signals and a volume of the output device outputting audio signals.

Specifically, the audio signal processing apparatus may correct the magnitude of the output signal for each of a plurality of frequency bands based on a difference between the playback loudness of the input signal and the desired loudness thereof. In this case, the audio signal processing apparatus may obtain the difference between the playback loudness of the input signal and the desired loudness thereof. The audio signal processing apparatus may correct the magnitude of the output signal for each of a plurality of frequency bands based on the obtained difference between the playback loudness of the input signal and the desired loudness thereof. In this case, the audio signal processing apparatus may use a relationship between the loudness and the sound pressure for each frequency band. Specifically, the audio signal processing apparatus may correct the magnitude of the output signal based on a sound pressure corresponding to a difference between a playback loudness and a desired loudness in each frequency band in a pre-specified sound pressure-loudness matrix for each frequency band. Specifically, the audio signal processing apparatus may determine a sound pressure for each of a plurality of frequency bands based on a difference between the playback loudness of the obtained input signal and the desired loudness thereof, and the sound pressure determined for each frequency band may compensate for the output signal. The determined sound pressure may a sound pressure corresponding to the difference between the playback loudness and the desired loudness in each frequency band in the pre-specified sound pressure-loudness matrix for each frequency band. The pre-specified sound pressure-loudness matrix for each frequency band may be an equal-loudness signal contour that is specified in advance.

A filter of the audio signal processing apparatus correcting the frequency spectrum of the output signal may be referred to as an even loudness equalizer (ELEQ) filter. The audio signal processing apparatus may obtain the ELEQ filter based on a loudness of the input signal and the playback parameter. Specifically, the audio signal processing apparatus may determine a coefficient of the ELEQ filter based on a loudness of the input signal and the playback parameter. The audio signal processing apparatus may correct the frequency spectrum of the output signal by using the ELEQ filter.

A case in which the audio signal processing apparatus determines the playback loudness based on the playback parameter will be described with reference to FIG. 2.

The audio signal processing apparatus may determine a playback loudness L_User based on a playback volume L_V and a target loudness L_T in order to obtain a coefficient of the ELEQ filter. Specifically, the audio signal processing apparatus may determine the playback loudness L_User according to Equation 1.

$$L\_User = L\_T + L\_V \quad \text{[Equation 1]}$$

The playback volume may be mapped in dB units according to the relationship between the volume interface defined for each output device and the actual volume. That is, when the total volume is the maximum, the playback volume may be mapped to 0 dB. In an audio system in which the first stage is defined as 3 dB attenuation, when the playback volume is the first stage, the playback volume may be mapped to −3 dB. For example, if L_T=−20 LKFS (loudness K-weighted relative to full scale) and L_V=−6 LKFS, L_User may be defined as −26 LKFS.

The audio signal processing apparatus may correct the frequency spectrum of the output signal based on the characteristics of the output device as well as the playback loudness. Specifically, the audio signal processing apparatus may obtain the desired loudness based on the characteristics of the output device. The characteristic of the output device may include a maximum loudness level that the output device is capable of outputting. Therefore, the audio signal processing apparatus may determine the coefficient of the ELEQ filter based on the characteristics of the output device as well as the playback loudness. In addition, the magnitude of the frequency response of the ELEQ filter may be 0 dB or more in all frequency bands. That is, the spectrum correction gain applied for each of the plurality of frequency bands may be 0 dB or more in all frequency bands.

In a specific embodiment, the audio signal processing apparatus may obtain an user loudness by adding the playback loudness to a maximum loudness level LL_MAX of the output device and a loudness strength adjustment factor. In this case, the maximum loudness level of the output device may be determined based on the maximum sound pressure of the output device. For example, when the maximum sound pressure of the output device is 120 dB, the maximum loudness level of the output device may be determined as 90 Phon. The audio signal processing apparatus may determine the user loudness according to Equation 2. In addition, the strength adjustment factor may be set based on at least one of a difference in the amount of sound of the output device such as earphones, a difference in intensity of sound that each person desires, and the equal-loudness contours.

$$LL\_User = L\_User + LL\_MAX + L\_Strength \quad \text{[Equation 2]}$$

L_Strength represents the strength adjustment factor described above, LL_MAX represents the maximum loudness level of the output device, L_User represents the playback loudness, and LL_User represents the user loudness level.

The audio signal processing apparatus may obtain a playback sound pressure, which is a sound pressure corresponding to the playback loudness for each of a plurality of frequency bands. Furthermore, the audio signal processing apparatus may obtain a maximum sound pressure of the output device, which is a sound pressure corresponding to the maximum loudness level of the output device for each of a plurality of frequency bands. The audio signal processing apparatus may obtain a sound pressure corresponding to the ELEQ filter based on a difference between the playback sound pressure for each frequency band and the maximum sound pressure of the output device. In this case, the audio signal processing apparatus may correct the frequency spectrum of the output signal by adding sound pressure for each frequency band defined in the form of the ELEQ filter in all frequency bands. Specifically, the audio signal processing apparatus may correct the frequency spectrum by using the largest difference between the playback sound pressure for each frequency band and the maximum sound pressure of the output device. In this way, the audio signal processing apparatus may correct the frequency spectrum of the output signal based on the sound pressure difference in the frequency band in which the change in loudness is most insensitive to the change in sound pressure. The audio signal processing apparatus may obtain a sound pressure corresponding to the ELEQ filter by using Equations 3 to 5.

$$SPL\_User[k] = EqualLoudnessContour(LL\_User)[k]$$
$$\text{for } k=0,1,\ldots,N \quad \text{[Equation 3]}$$

$$SPL\_MAX[k] = EqualLoudnessContour(LL\_MAX)[k]$$
$$\text{for } k=0,1,\ldots,N \quad \text{[Equation 4]}$$

$$SPL\_ELEQ[k] = SPL\_User[k] - SPL\_MAX[k] + \max$$
$$(\{SPL\_MAX[0] - SPL\_User[0], SPL\_MAX[1] -$$
$$SPL\_User[1], \ldots, SPL\_MAX[N] - SPL\_$$
$$User[N]\}) \text{ for } k=0,1,\ldots,N \quad \text{[Equation 5]}$$

k represents the frequency bin index, SPL_User[k] represents the playback sound pressure in the frequency band where the frequency bin index is k, and SPL_MAX[k] represents the maximum sound pressure of the output device in the frequency band where the frequency bin index is k. EqualLoudnessCountour represents the matrix between the loudness and the sound pressure. The matrix between the loudness and the sound pressure may be an equal-loudness contour. max(x, y, z) represents the maximum value among x, y, and z. When the audio signal processing apparatus corrects the frequency spectrum of the output signal based on the maximum loudness of the output device, the audio signal processing apparatus provides the same level of perceived resolution for each frequency as that when the output device outputs the output signal at maximum volume. Therefore, when the audio signal processing apparatus estimates the user loudness by using the maximum loudness of the output device, the resolution of the output signal may be kept higher than when the audio signal processing apparatus estimates the user loudness only with the volume or integrated loudness.

Figure 3:
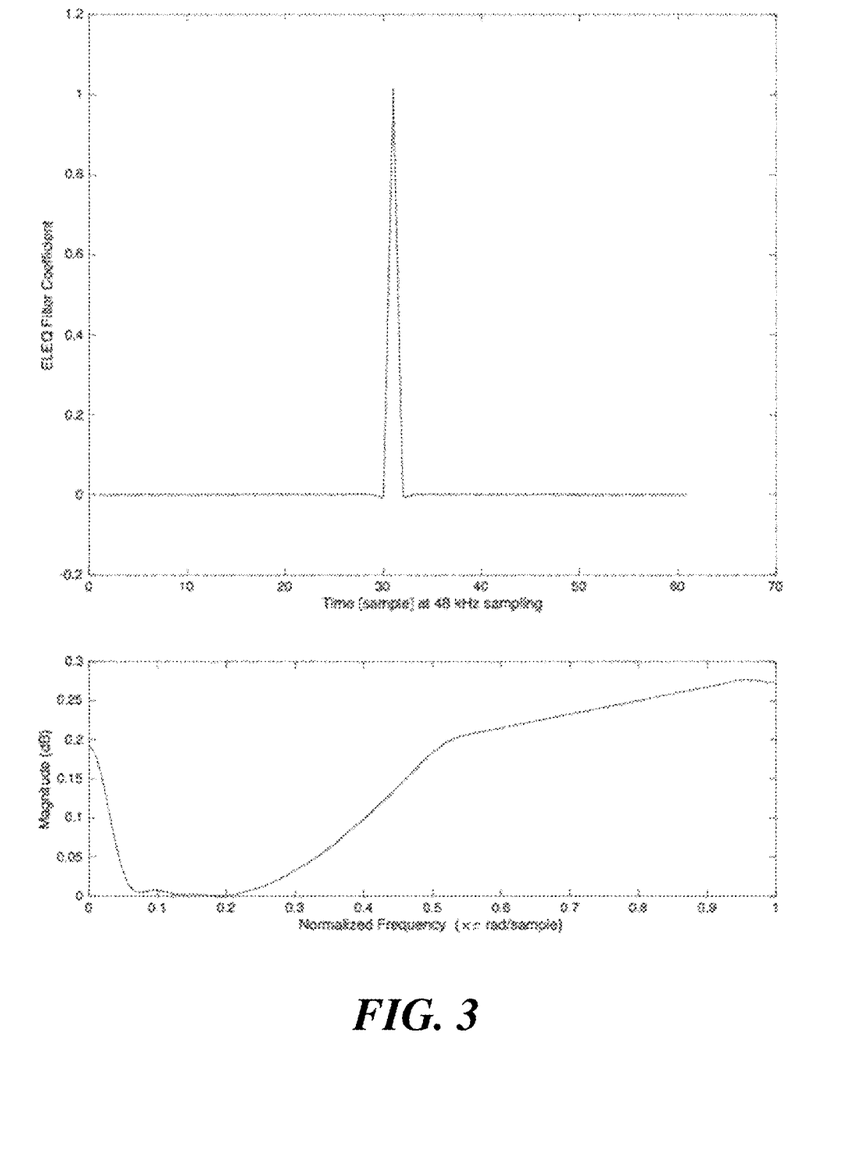
FIG. 3 is a diagram illustrating an example of a frequency response of ELEQ to the maximum loudness of a playback loudness output device.
Figure 4:
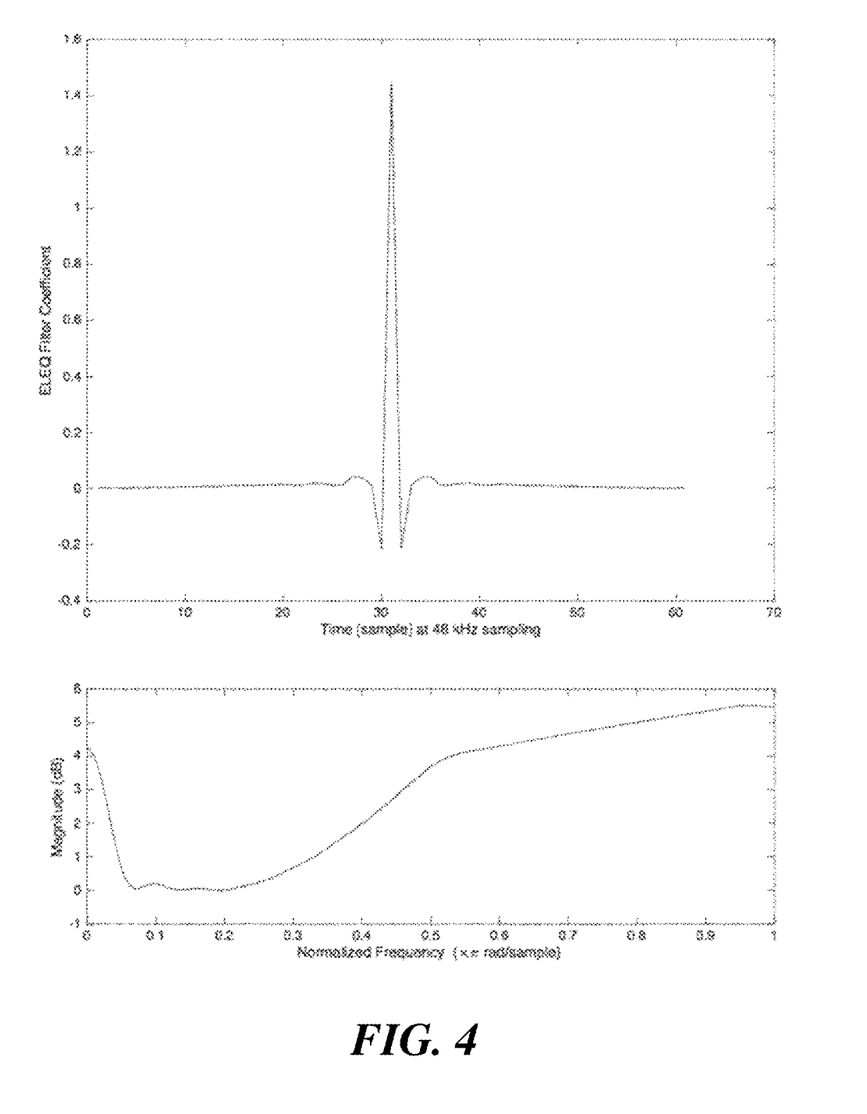
FIG. 4 is a diagram illustrating another example of a frequency response of ELEQ to the maximum loudness of the playback loudness output device.

FIGS. 3 and 4 are diagrams illustrating examples of a frequency response of ELEQ to the maximum loudness of the playback loudness output device. FIG. 3 is an example of the frequency response of the ELEQ filter, which is a form of a 61st finite impulse response (FIR) filter when the user loudness LL_User is 89 Phon and the maximum loudness LL_MAX of the output device is 90 Phon. FIG. 4 is an example of the frequency response of the ELEQ filter, which is a form of the 61st FIR filter when the user loudness LL_User is 69 Phon and the maximum loudness LL_MAX of the output device is 89 Phon.

If the output device is not changed, the maximum loudness of the output device does not change. Therefore, in Equation 3 above, EqualLoudnessContour(LL_User) may be expressed as F(L_User+L_Strength), which is a function of the playback loudness and strength adjustment factor. SPL_ELEQ[k], which is the sound pressure of ELEQ for each frequency band in Equation 5, may be expressed as SPL_ELEQ[k]=F2(L_User_+L_Strength). Consequently, the sound pressure of the ELEQ for each frequency band may be determined by the playback loudness and the strength adjustment factor. As described above, the audio signal processing apparatus may adjust the frequency spectrum of the output signal based on the difference between the playback loudness and the strength adjustment factor. That is, the ELEQ filter may correct the frequency spectrum perceived through the playback loudness to a frequency spectrum for attenuating the loudness by the strength adjustment factor. After all, when the strength adjustment factor is determined, the ELEQ filter maintains the tone when the output signal is played back with the loudness of the strength adjustment factor, regardless of the playback loudness.

When the playback volume is changed, the playback loudness value is changed and the sound pressure values that match the loudness are also changed. As the playback volume is changed, the coefficient of the ELEQ filter may also be changed, and discontinuity of the output signal may occur. The audio signal processing apparatus may fade out the ELEQ filter applied before the volume is changed, and fade in the ELEQ filter applied after the volume is changed. In this way, the audio signal processing apparatus may prevent discontinuity of the output signal.

Figure 5:
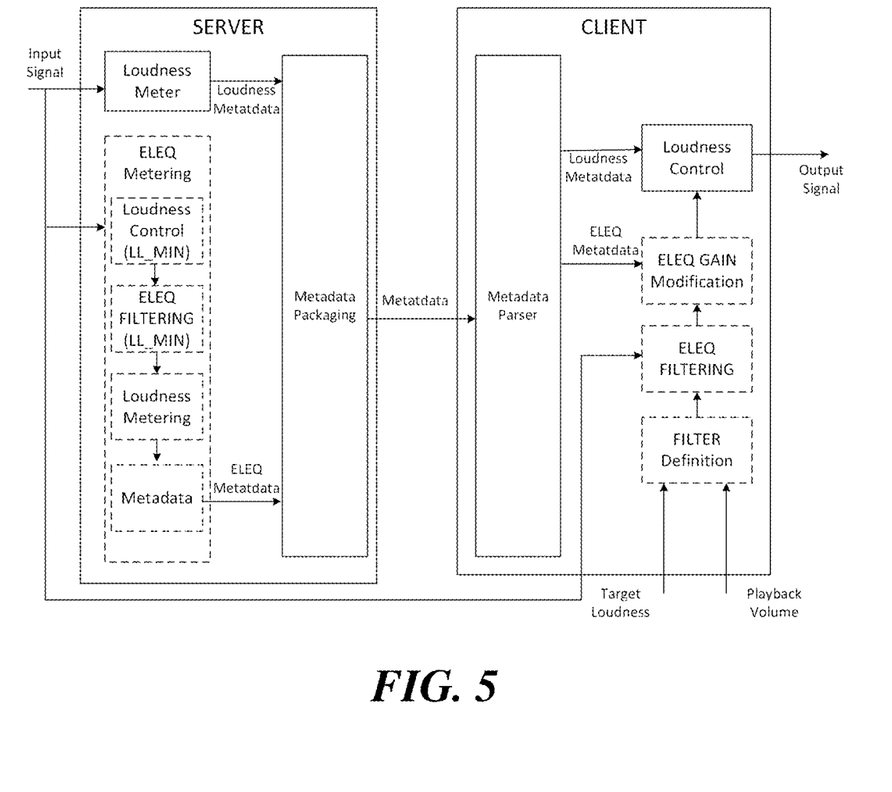
FIG. 5 is a diagram illustrating a loudness correction process applied after frequency spectrum correction in a server-client system.

FIG. 5 is a diagram illustrating a loudness correction process applied after frequency spectrum correction in a server-client system.

When the loudness correction is applied in the server-client system, it is common that the integrated loudness L_Int of content is measured in the server and adjusted to the target loudness L_T in the client. In the system, the loudness of the output signal may be kept constant regardless of the content. When the ELEQ filter described with reference to FIGS. 3 to 4 is applied, the loudness is changed according to the characteristics of the input signal. Therefore, a method may be required for keeping the loudness of the output signal constant regardless of the input signal.

In FIG. 5, blocks indicated by solid lines perform general loudness adjustment, and blocks indicated by dotted lines perform the aforementioned ELEQ-related operation. The server performs ELEQ filtering to maintain the loudness of the output signal at a loudness level LL_Ref corresponding to a specific reference playback loudness L_Ref. The server measures the integrated loudness of an output signal Out_Ref through a loudness measurement block (loudness meter). The measured integrated loudness is defined as a reference EQ applied loudness L_EQ_Ref. In this case, the reference EQ applied loudness may be set as the playback loudness. Further, the reference playback loudness may be a sum of a minimum value of target loudness and a minimum value of sound pressure of a playback volume, which is a value of the minimum loudness that may be played.

The user playback loudness L_User0 may be determined based on the target loudness L_T0 and the user volume L_V0 set in the client. The client may use the playback loudness to select an ELEQ filter and filter the input signal with the selected ELEQ filter. The client may obtain a gain DL_Int_Predict for loudness correction by using a reference loudness L_EQ_Ref with the filtered signal Out_ELEQ. Specifically, the client may obtain a gain for loudness correction according to Equation 6.

$$DL\_Int\_Predict=(L\_EQ\_Ref-L\_Ref-G\_A)/(L\_Ref+G\_B)*(L\_User0+G\_B) \quad \text{[Equation 6]}$$

In Equation 6, L_User0 represents the playback loudness, and L_EQ_Ref represents the reference EQ applied loudness calculated and transmitted by the server. In addition, L_Ref represents the reference playback loudness set in the server. In addition, G_A and G_B represent factors for adjusting the degree of correction of the ELEQ loudness. The client may obtain the final output signal by using Equation 7.

$$Out\_ELEQ\_DL=Out\_ELEQ*10^{(-DL\_Int\_Predict/20)} \quad \text{[Equation 7]}$$

Out_ELEQ represents a signal filtered by the ELEQ filter. In addition, DL_Int_Predict represents the gain for the loudness correction described above, and when G_A=0, G_B=0, and L_User0 and L_Ref are the same, DL_Int_Predict has a value as much as the integrated loudness increases after ELEQ filtering. Therefore, when Equation 7 is applied, the loudness is corrected as much as the integrated loudness increases. Specifically, L_EQ_Ref, which is the loudness of the signal that is ELEQ-filtered, is greater than L_Ref, which is the loudness of the signal that is not ELEQ-filtered, and both L_Ref and L_User0 are numbers less than zero. DL_Int_Predict may represent the increased amount of the loudness of the final output signal from the playback loudness. Therefore, the increased amount of loudness may be corrected through Equation 7 described above.

G_A, the factor for adjusting the degree of correction of the ELEQ loudness described above is defined by applying, to L_User0, the ratio of the difference between the loudness when the ELEQ filter is used and the loudness when the ELEQ filter is not used. The final loudness of the signal filtered by the ELEQ filter is the sum of the target loudness and G_A/(L_Ref+G_B)*(L_User0+G_B). According to the embodiment, in the audio signal processing apparatus, the loudness of signals to which the ELEQ filter is applied under the same condition may be kept the same, although there is a deviation in loudness depending on whether or not ELEQ filtering is performed.

In the equation described above, the variable including L_represents loudness in a waveform stage, and may represent a variable in units of loudness unit relative to full scale (LUFS) or LKFS. The variable including LL_may represent a variable in units of Phon as a loudness level.

Figure 6:
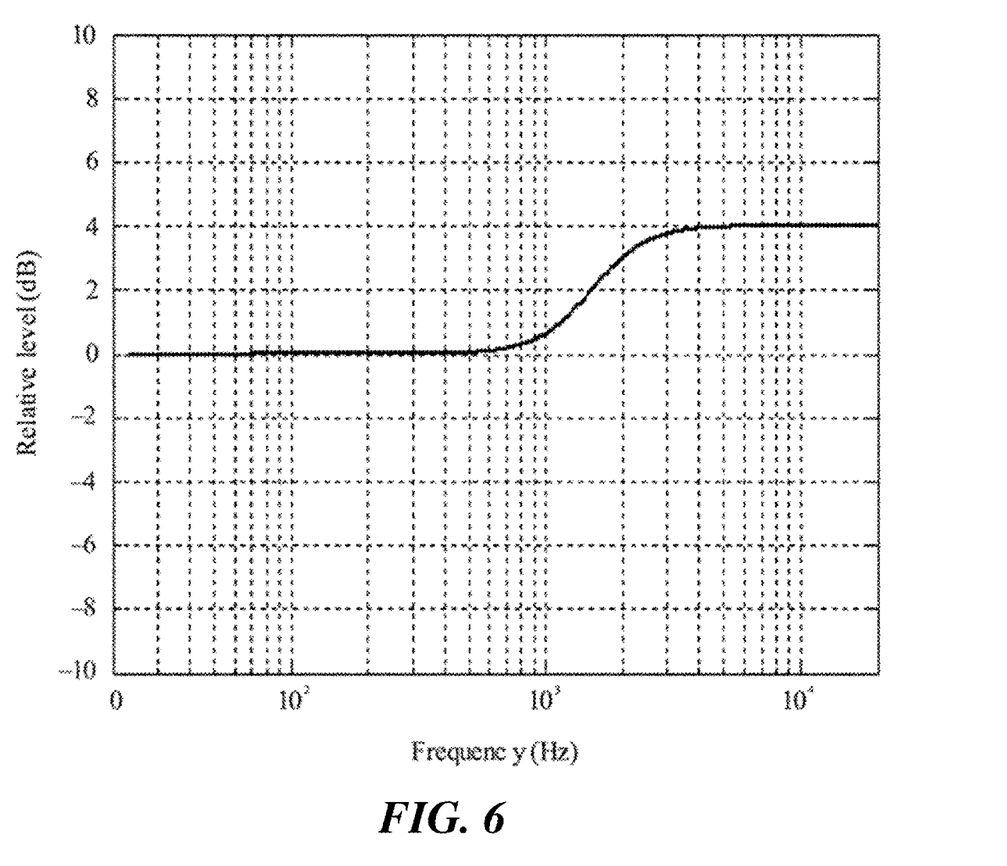
FIG. 6 is a diagram illustrating a frequency response of a first-order pre-filter of a K-weighting filter defined in ITU-R BS.1770-4.
Figure 7:
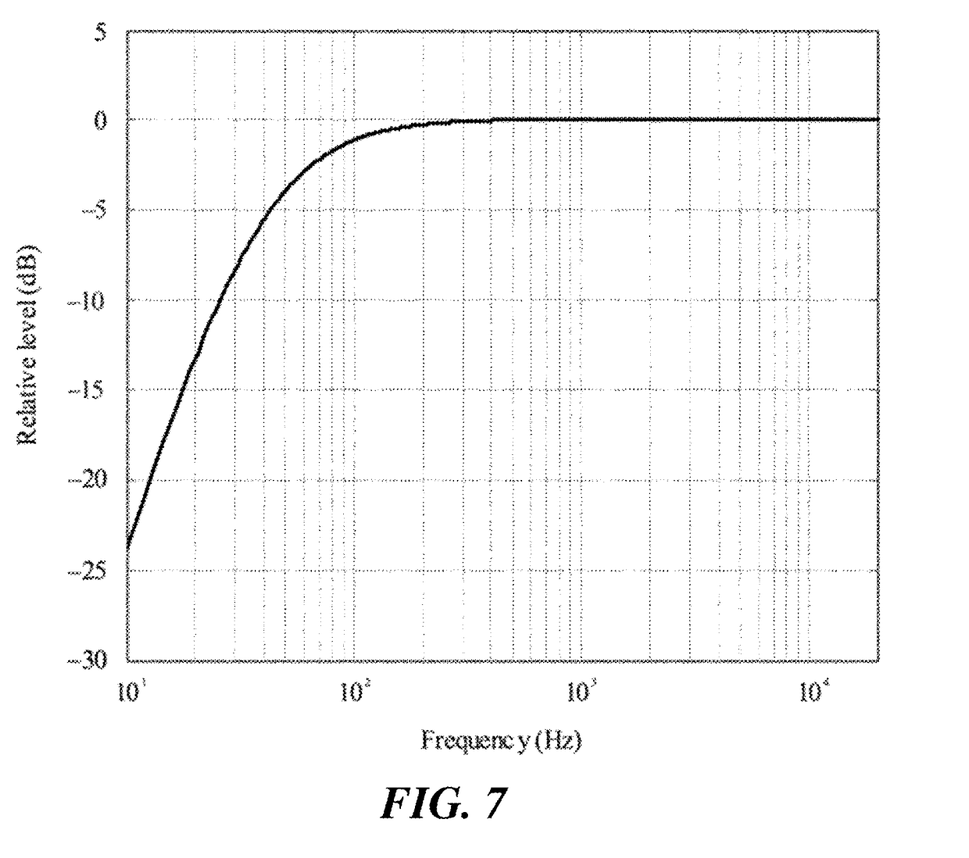
FIG. 7 is a diagram illustrating a frequency response of a second-order pre-filter of a K-weighting filter defined in BS.1770-4.

The audio signal processing apparatus may apply a K-weighting filter used in loudness calculation to the input signal and then frequency-convert the filtered signal. The audio signal processing apparatus may calculate WLoud_MB, which is a loudness ratio (a multiband weight in loudness) for each of the frequencies of all the input signals, by using the frequency-converted signal. Specifically, the audio signal processing apparatus may obtain WLoud_MB by using Equation 8.

$$x\_k=\text{filter}(h\_k\text{weight},x\_\text{in}) \text{ or}$$

$$x\_k=\text{filter}(h\_pre2\_k\text{weight},\text{filter}(h\_pre1\_k\text{weight},x\_\text{in})) \quad \text{[Equation 8]}$$

filter(A,B) represents an operation for filtering the B signal by A coefficient. h_kweight represents a filter in which the K-weighting filter is expressed as a single filter. h_pre1_kweight and h_pre2_kweight represent the first-order pre-filter and the second-order pre-filter of the K-weighting Filter defined in ITU-R BS.1770-4. FIG. 6 is a diagram illustrating a frequency response of the first-order pre-filter of a K-weighting filter defined in ITU-R BS.1770-4, and FIG. 7 is a diagram illustrating a frequency response of the second-order pre-filter of a K-weighting filter defined in BS.1770-4.

The k-weighted signal x_k obtained through Equation 8 may be divided into frames as shown in Equation 9. When the length of the frame is NF and a hop size is NH, the 1-th frame signal x_frame[1] may be expressed as in Equation 9.

$$x\_frame[1]=x\_k[((1-1)*NH+1):((1-1)*NH+NF)] \quad \text{[Equation 9]}$$

The frame signal x_frame[1] may be converted into xw_frame[1] through windowing required for frequency analysis. In this case, a rectangular window with all coefficients equal to 1 may be used as the window coefficient wind. In still other specific embodiments, various window types, such as hamming and hanning, may be used as the window coefficient wind.

$$xw\_frame[1][n]=x\_frame[1][n]*wind[n] \text{ for } n=1,2,\ldots,NF \quad \text{[Equation 10]}$$

The signal xw_frame to which the wind is applied may be transformed into a frequency domain as shown in Equation 10 through a discrete Fourier transform, and may be represented as a frequency signal XW_frame[1]. DFT{ } in Equation 11 represents the discrete Fourier transform.

$$XW\_frame[1]=DFT\{xw\_frame[1][1:NF]\} \quad \text{[Equation 11]}$$

The power for each bin of the converted frequency signal XW_frame[1] may be obtained as shown in Equation 12. In Equation 12, P_frame_bin[1][k] represents the power in the k-th bin of the 1-th frame.

$$P\_frame\_bin[l][k]=XW\_frame[l][k]*conj(XW\_frame[l][k]) \text{ for } k=1,2,\ldots,NF \quad \text{[Equation 12]}$$

P_frame_bin[1][k], which is the power for each bin, is mapped to a desired frequency band, and may be converted to P_frame_band[1][b], which is the power for each band, through Equation 13. In Equation 13, band[b] is a table indicating the index of a start bin of band b, and may be used to obtain the sum of powers of bins from band[b] to band[b+1]-1.

$$P\_frame\_band[1][b]=sum\_\{k \text{ from } band[b] \text{ to } band[b+1]-1\}(P\_frame\_bin[1][k]) \quad \text{[Equation 13]}$$

P_frame_band[1][b] is obtained for the entire section of the input signal, and when P_frame_band[1][b] is added in all frames, power for each frequency band is obtained in the entire section. In Equation 14, P_band[b] represents the power of each frequency band in the entire section. In this case, NumberOfFrames represents the number of all frames, and the frame index 1 is a natural number from 1 to NumberOfFrames.

$$P\_band[b]=sum\_\{1 \text{ from } 1 \text{ to } NumberOfFrames\}(P\_frame\_band[l][b]) \quad \text{[Equation 14]}$$

The power for each band, P_band[b], is the sum of the powers of all frames, and in Equation 15, WLoud_MB[b] is a normalized value of P_band[b]. NumberOfBands in Equation 15 represents the number of all bands, and a band index, b is a natural number from 1 to NumberOfBands.

$$WLoud\_MB[b]=P\_band[b]/[sum\_\{b \text{ from } 1 \text{ to NumberOfBands}\}(P\_band[b])] \quad \text{[Equation 15]}$$

The L_EQ_Ref and L_Ref described above may be calculated through Equations 8 to 15, respectively. In this case, the loudness of each band, P_band, may also be calculated individually.

In the above-described embodiments, the equal-loudness contours have been used. The equal-loudness contour is a curve showing the relationship between the loudness and the sound pressure for each frequency. In this case, the loudness is a subjectively perceived loudness, and there may be a difference in loudness perceived by individuals. Therefore, the listening experience of listeners may be improved with the method for optimizing the equal-loudness contour.

First, a method for providing a personalized equal-loudness contour will be described. The audio signal processing apparatus may obtain an equal-loudness contour measured for each individual. Specifically, the audio signal processing apparatus may obtain gains of signals perceived as the same loudness for a plurality of predetermined signals from a listener. In this case, the predetermined signals may be a plurality of tone signals or narrowband noises.

In another specific embodiment, the audio signal processing apparatus may generate an equal-loudness contour based on a gain curve for each of a plurality of pre-specified frequency bands. The gain curve for each frequency band represents a gain applied for each frequency band to obtain any one loudness. The audio signal processing apparatus may obtain an equal-loudness contour corresponding to a desired loudness by interpolating or extrapolating a plurality of frequency band gain curves. In this case, the plurality of frequency band gain curves may be A-weighting, B-weighting, and C-weighting curves. In another specific embodiment, the plurality of frequency band gain curves may be gain values for each frequency band obtained from a listener. The plurality of frequency band gain curves may be combinations of preset frequency band gain curves and frequency band gain curves obtained from a user.

Figure 8:
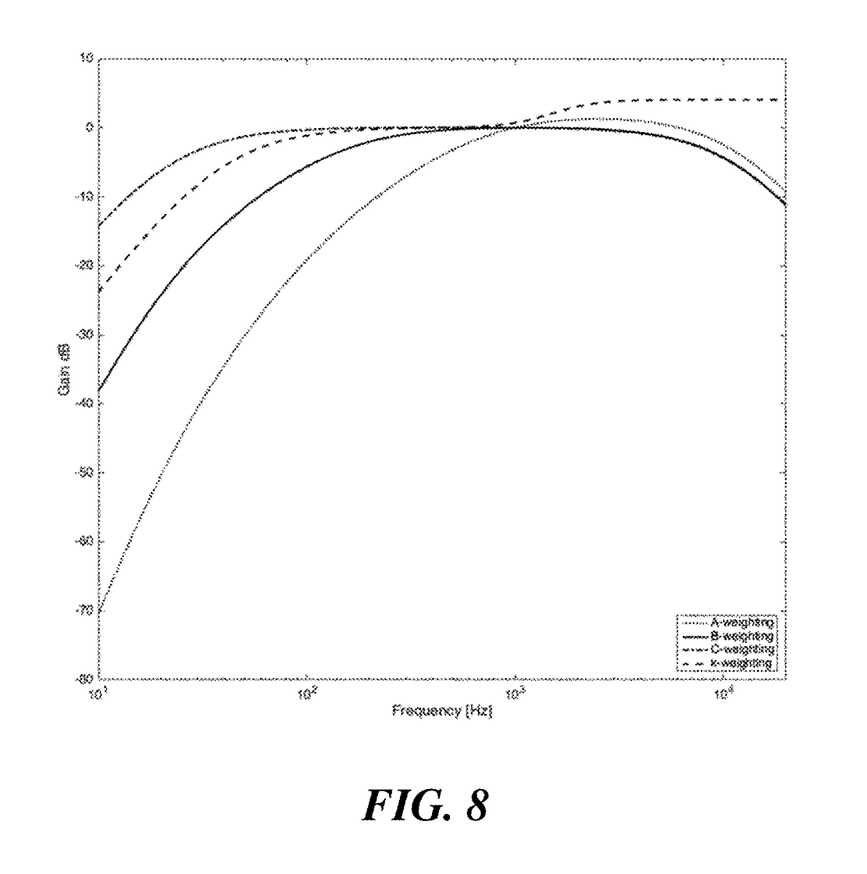
FIG. 8 is a diagram illustrating an example of a plurality of frequency band gain curves.

FIG. 8 is a diagram illustrating an example of the plurality of frequency band gain curves described above.

The A-weighting curve is a frequency band gain curve generated based on the loudness of 40 phon when a 1 kHz tone signal is played back at 40 dB. The C-weighting curve is a frequency band gain curve generated based on 80 phon, and may be used to measure the loudness of a signal having a higher sound pressure level than when the A-weighting curve is used. The K-weighting curve is a frequency band gain curve generated based on 60 dB. The K-weighting curve is used for loudness measurements in various standards such as ITU-R and EBU. The K-weighting curve is used to measure the loudness of a typical sound playback level. When the playback level of sound is adjusted, it may be desirable to use a frequency band gain curve corresponding to the playback level. For example, the A-weighting curve in FIG. 8 has a gain of −20 dB at 100 Hz. The C-weighting curve has a gain of 0 dB at 100 Hz. This means that when the playback level is increased from 40 dBA to 80 dBA, or when the loudness is changed from 40 phon to 80 phon, the 100 Hz signal is much more audible and the 100 Hz signal has a greater effect on the loudness. Accordingly, the tone of the sound signal perceived by the listener also changes with the change in the playback level. Therefore, a method for adjusting the gain curve of the frequency band applied with the change in the playback level will be described. The description will be made, assuming that 60 dBA is the median point, 40 dBA is the lowest point, and 80 dBA is the highest point.

It is assumed that the loudness measured based on the k-weighting of a signal is X1 [LKFS] and the current playback level is 60 dBA. In this case, the perceived loudness may be X1 [LKFS]. If the frequency gain curve applied when the playback level is adjusted to 40 dBA by the volume is not adjusted, the loudness perceived by the listener may be X1-20 [LKFS]. Since the playback level is 40 dBA, when the loudness is measured by applying the A-weighting curve rather than the k-weighting curve, the loudness may be X1-20+alpha LKFS. In this case, alpha is a component of the signal itself. In addition, alpha may have a positive value, a negative value, or 0. In the previous embodiment, the coefficient of the ELEQ filter may be set based on an alpha value. This alpha may play a role in correcting not only the playback volume but also the change in sensitivity to low-frequency and high-frequency sounds that change with the volume change. Referring to FIG. 8 as an example, a boosting gain is required in a band of 1 kHz or less, which is a relatively low frequency band, and a relatively small boosting gain or attenuation gain is required compared to the low frequency band in a band of 1 kHz or higher, which is a relatively high frequency band. That is, in a relatively low frequency band of 1 kHz or less, the value of alpha is a positive value, and in a relatively high frequency band of 1 kHz or higher, the value of alpha is a positive value smaller than that in the low frequency band or negative value. Although several playback levels and several frequency band gain curves have been described as examples for the description of the embodiment, the present embodiment is not limited thereto.

In the above-described embodiment, the audio signal processing apparatus may adjust the degree of application of ELEQ. This is because there may be listeners who do not want tonal correction caused by ELEQ.

The audio signal processing apparatus may set a loudness contour to which an ELEQ applied intensity is applied based on the basic equal-loudness contour and 0 dB flat response. In this case, the basic equal-loudness contour may be an equal-loudness contour having a minimum value of the magnitude response greater than 0. The audio signal apparatus may set the ELEQ filter based on the set equal-loudness contour and the playback loudness. In this case, as described above, the playback loudness may be set based on any one of the volume of the output device, the integrated loudness of the entire or specific section of the input signal, and the target loudness. The ELEQ filter generated as described above may have a dependence on the volume of the output device. The audio signal processing apparatus may interpolate/extrapolate the ELEQ filter table set depending on the volume of the output device to obtain a coefficient of the ELEQ filter corresponding to the volume of the current output device. This may be the same as the operation described with reference to FIG. 8. As another specific embodiment, the audio signal processing apparatus may set the ELEQ filter table set depending on the volume of the output device as the ELEQ filter having the maximum effect of the ELEQ filter applied, and may adjust the value of the ELEQ filter table set depending on the applied intensity of the ELEQ filter.

Figure 9:
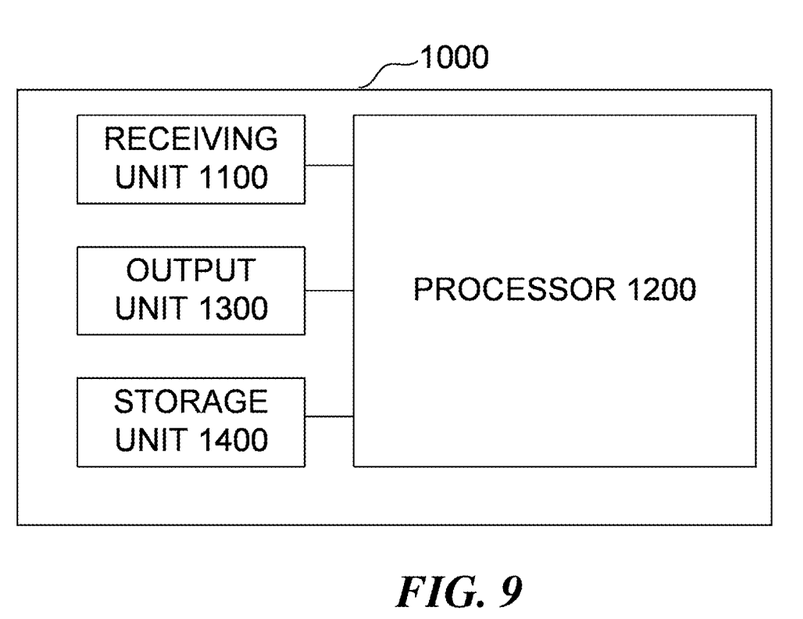
FIG. 9 is a block diagram illustrating a configuration of an audio signal processing apparatus according to an embodiment of the present invention.

FIG. 9 is a block diagram illustrating a configuration of an audio signal processing apparatus 1000 according to an embodiment of the present invention.

According to an embodiment, the audio signal processing apparatus 1000 may include a receiving unit 1100, a processor 1200, an output unit 1300, and a storage unit 1400. However, not all of the components illustrated in FIG. 9 are essential components of the audio signal processing apparatus. The audio signal processing apparatus 1000 may additionally include components not illustrated in FIG. 9. In addition, at least some of the components of the audio signal processing apparatus 100 illustrated in FIG. 9 may be omitted. For example, the audio signal processing apparatus according to an embodiment may not include the receiving unit 1100 and the output unit 1300.

The receiving unit 1100 may receive input content input to the audio signal processing apparatus 1000. The receiving unit 1100 may receive an input signal for which an output loudness level is adjusted by the processor 1200. According to an embodiment, the receiving unit 1100 may include an input terminal for receiving an input signal transmitted by wire. In addition, the receiving unit 1100 may include a wireless receiving module for receiving an input signal transmitted wirelessly.

According to an embodiment, the audio signal processing apparatus 1000 may include a separate decoder. In this case, the receiving unit 1100 may receive an encoded bitstream of the input content. In addition, the encoded bitstream may be decoded as the input content through a decoder. Additionally, the receiving unit 1100 may receive additional information related to the input content.

According to an embodiment, the receiving unit 1100 may include a transmission/reception unit for transmitting and receiving data with an external device through a network. In this case, the data may include at least one of a bitstream of the input content or additional information. The receiving unit 1100 may include a wired transmission/reception terminal for receiving data transmitted by wire. In addition, the receiving unit 1100 may include a wireless transmission/reception module for receiving data transmitted wirelessly. In this case, the receiving unit 1100 may receive data transmitted wirelessly using a Bluetooth or Wi-Fi communication method. Further, the receiving unit 1100 may receive data transmitted according to a mobile communication standard such as long term evolution (LTE) and LTE-advanced, and the present invention is not limited thereto. The receiving unit 1100 may receive various types of data transmitted according to various wired and wireless communication standards.

The processor 1200 may control the overall operation of the audio signal processing apparatus 100. The processor 1200 may control each component of the audio signal processing apparatus 100. The processor 1200 may perform calculations and processing of various data and signals. The processor 1200 may be implemented as hardware in the form of a semiconductor chip or an electronic circuit, or may be implemented as software that controls hardware. The processor 1200 may be implemented in a form in which the hardware and the software are combined. For example, the processor 1200 may control operations of the receiving unit 1100, the output unit 1300, and the storage unit 1400 by executing at least one program. In addition, the processor 1200 may perform the operations described with reference to FIGS. 1 to 8 by executing at least one program.

The output unit 1300 may output an output signal. The output unit 1300 may output an output signal of which output loudness level is adjusted from the input signal by the processor 1200. The output unit 1300 may be connected to an output device that outputs the output signal or may include an output device.

According to an embodiment, the output unit 1300 may include output means for outputting an output signal. For example, the output unit 1300 may include an output terminal outputting an output audio signal to the outside. In this case, the audio signal processing apparatus 100 may output an output audio signal to an external apparatus connected to the output terminal. The output unit 1300 may include a wireless audio transmission module outputting an output audio signal to the outside. In this case, the output unit 1300 may output an output audio signal to an external device using a wireless communication method such as Bluetooth or Wi-Fi.

In addition, the output unit 1300 may include a speaker. In this case, the audio signal processing apparatus 100 may output an output audio signal through the speaker. In addition, the output unit 1300 may additionally include a converter (e.g., digital-to-analog converter (DAC)) for converting a digital audio signal into an analog audio signal. Additionally, the output unit 1300 may include display means for outputting a video signal included in the output content.

The storage unit 1400 may store at least one of data or programs for processing and controlling the processor 1200. For example, the storage unit 1400 may store a loudness measurement value obtained through the processor 1200. In addition, the storage unit 1400 may store data input to the audio signal processing apparatus 1000 or output from the audio signal processing apparatus 1000. The storage unit 1400 may include at least one memory. In this case, the memory may include at least one storage medium of a flash memory type memory, a hard disk type memory, a multimedia card micro type memory, a card type memory (for example, SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

Although the present invention has been described above through specific embodiments, but those skilled in the art can make modifications and changes without departing from the spirit and scope of the present invention. That is, although the present invention has been described with respect to an embodiment of processing multiple audio signals, the present invention is equally applicable and extendable to various multimedia signals including video signals as well as audio signals. Therefore, what could be easily conceived by those skilled in the field upon reading the detailed description and examples of the present invention is to be construed as falling within the scope of the present invention.

The invention claimed is:

1. An audio signal processing apparatus comprising:
an input terminal provided to receive an input audio signal;
a processor configured to:
obtain a difference between a playback loudness of the input audio signal and a desired loudness thereof,
correct a frequency band spectrum of an output audio signal for each of a plurality of frequency bands based on the difference between the playback loudness and the desired loudness of the input audio signal and a relationship between a loudness and a sound pressure for each of the plurality of frequency bands, and
apply a loudness modification gain to the output audio signal of which frequency band spectrum is corrected, wherein the loudness modification gain is obtained based on the desired loudness and a loudness of the output audio signal of which frequency band spectrum is corrected; and
an output terminal provided to output the output audio signal,
wherein the playback loudness is a loudness of the output audio signal when the input audio signal is output without the correction,
wherein the loudness modification gain is obtained below equation, $$DL\_Int\_Predict=(L\_EQ\_Ref-L\_Ref-G\_A)/(L\_Ref+G\_B)*(L\_User0+G\_B)$$

wherein DL_Int_Predict represents the loudness modification gain,
L_EQ_Ref represents the loudness of the output audio signal which frequency band spectrum is corrected,
L_Ref represents the desired loudness,
G_A and G_B represents factors for adjusting the degree of correction of the loudness of the output audio signal which frequency band spectrum is corrected.

2. The audio signal processing apparatus of claim 1, wherein the processor is configured to obtain the desired loudness based on a characteristic of an output device outputting the output audio signal.

3. The audio signal processing apparatus of claim 2, wherein the characteristic of the output device includes a maximum loudness level that the output device is capable of outputting.

4. The audio signal processing apparatus of claim 1, wherein a spectrum correction gain for each of the plurality of frequency bands used for the correction is 0 dB or more in all frequency bands.

5. The audio signal processing apparatus of claim 1, wherein the processor is configured to obtain the playback loudness based on a playback volume.

6. The audio signal processing apparatus of claim 5, wherein the playback volume is a volume applied independently of the output device.

7. The audio signal processing apparatus of claim 5, wherein the playback volume is a volume of the output device.

8. An operation method for an audio signal processing apparatus, the operation method comprising:
receiving an input audio signal;
obtaining a difference between a playback loudness of the input audio signal and a desired loudness thereof;
correcting a frequency band spectrum of an output audio signal for each of a plurality of frequency bands based on the difference between the playback loudness and the desired loudness of the input audio signal and a relationship between a loudness and a sound pressure for each of the plurality of frequency bands;
applying a loudness modification gain to the output audio signal of which frequency band spectrum is corrected, wherein the loudness modification gain is obtained based on the desired loudness and a loudness of the output audio signal of which frequency band spectrum is corrected; and
outputting the output audio signal,
wherein the playback loudness is a loudness of the output audio signal when the input audio signal is output without the correction,
wherein the loudness modification gain is obtained below equation, $$DL\_Int\_Predict=(L\_EQ\_Ref-L\_Ref-G\_A)/(L\_Ref+G\_B)*(L\_User0+G\_B),$$

wherein DL_Int_Predict represents the loudness modification gain,
L_EQ_Ref represents the loudness of the output audio signal which frequency band spectrum is corrected,
L_Ref represents the desired loudness,
G_A and G_B represents factors for adjusting the degree of correction of the loudness of the output audio signal which frequency band spectrum is corrected.

9. The operation method of claim 8, wherein the obtaining the difference between the playback loudness of the input audio signal and the desired loudness thereof comprises:
obtaining the desired loudness based on a characteristic of an output device outputting the output audio signal.

10. The operation method of claim 9, wherein the characteristic of the output device includes a maximum loudness level that the output device is capable of outputting.

11. The operation method of claim 8, wherein a spectrum correction gain for each of the plurality of frequency bands used for the correction is 0 dB or more in all frequency bands.

12. The operation method of claim 8, wherein the obtaining the difference between the playback loudness of the input audio signal and the desired loudness thereof comprises:
   obtaining the playback loudness based on a playback volume.

13. The operation method of claim 12, wherein the playback volume is a volume applied independently of the output device.

14. The operation method of claim 12, wherein the playback volume is a volume of the output device.

* * * * *